US009478238B1

(12) United States Patent
Degawa et al.

(10) Patent No.: US 9,478,238 B1
(45) Date of Patent: Oct. 25, 2016

(54) MAGNETO-RESISTIVE EFFECT ELEMENT WITH RECESSED ANTIFERROMAGNETIC LAYER (71) Applicant: TDK Corporation, Tokyo (JP)

(72) Inventors: Naomichi Degawa, Tokyo (JP); Kenzo Makino, Tokyo (JP); Satoshi Miura, Tokyo (JP); Takayasu Kanaya, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 14/753,301

(22) Filed: Jun. 29, 2015

Related U.S. Application Data (63) Continuation-in-part of application No. 14/672,693, filed on Mar. 30, 2015, now abandoned.

(51) Int. Cl.
G11B 5/39 (2006.01)
G11B 5/60 (2006.01)

(52) U.S. Cl.
CPC ........... *G11B 5/3912* (2013.01); *G11B 5/6082* (2013.01)

(58) Field of Classification Search
None
See application file for complete search history.

(56) References Cited

U.S. PATENT DOCUMENTS

| 7,220,499 | B2 | 5/2007 | Saito et al. | |
| 7,327,539 | B2 | 2/2008 | Saito | |
| 7,365,949 | B2* | 4/2008 | Hayakawa | G11B 5/39 360/324.1 |
| 7,599,155 | B2* | 10/2009 | Saito | G11B 5/3903 360/322 |
| 7,616,411 | B2* | 11/2009 | Gill | B82Y 25/00 360/321 |
| 7,800,867 | B2 | 9/2010 | Saito et al. | |
| 7,952,839 | B2 | 5/2011 | Yamazaki et al. | |
| 8,437,106 | B2 | 5/2013 | Yanagisawa et al. | |
| 8,462,467 | B2 | 6/2013 | Yanagisawa et al. | |
| 8,711,528 | B1 | 4/2014 | Xiao et al. | |
| 9,065,043 | B1* | 6/2015 | Xiao | G11B 5/3909 |
| 9,230,565 | B1* | 1/2016 | Xiao | G11B 5/11 |
| 2004/0061983 | A1* | 4/2004 | Childress | B82Y 10/00 360/324.2 |
| 2008/0180863 | A1* | 7/2008 | Gill | B82Y 10/00 360/324.2 |
| 2009/0086385 | A1* | 4/2009 | Gill | B82Y 10/00 360/324.11 |
| 2010/0232072 | A1* | 9/2010 | Dimitrov | B82Y 25/00 360/319 |
| 2012/0134057 | A1* | 5/2012 | Song | B82Y 10/00 360/319 |
| 2012/0276415 | A1* | 11/2012 | Sapozhnikov | G01R 33/093 428/831 |

FOREIGN PATENT DOCUMENTS

JP 2005-263344 A 9/2005

* cited by examiner

*Primary Examiner* — Will J Klimowicz
(74) *Attorney, Agent, or Firm* — Posz Law Group, PLC (57) ABSTRACT A magneto-resistive effect element (MR element) has a first shield layer; a second shield layer; an inner shield layer that is positioned between the first shield layer and the second shield layer, and that makes contact with the first shield layer and faces the air bearing surface (ABS); and a multilayer film that is positioned between the first shield layer and the second shield layer. The multilayer film has a free layer; a first pinned layer; a nonmagnetic spacer layer; a second pinned layer that fixes the magnetization direction of the first pinned layer; and an antiferromagnetic layer that is exchange-coupled with the second pinned layer. The antiferromagnetic layer faces the back surface of the inner shield layer viewed from the ABS. The MR element has an insulating layer positioned between the antiferromagnetic layer and the inner shield layer.

10 Claims, 11 Drawing Sheets

MAGNETO-RESISTIVE EFFECT ELEMENT WITH RECESSED ANTIFERROMAGNETIC LAYER

This application is a continuation-in-part of U.S. application Ser. No. 14/672,693, filed Mar. 30, 2015.

BACKGROUND OF THE INVENTION

1. Field of the Invention

The present invention relates to a magneto-resistive effect element (MR element), and it particularly relates to an MR element where an antiferromagnetic layer that fixes a magnetization direction of a pinned layer is recessed from the air bearing surface (ABS).

2. Description of the Related Art

A MR element has a multilayer film inducing a magneto-resistive effect, and two magnetic shield layers between which the multilayer film is disposed in the down track direction (track circumferential direction or lamination direction of the multilayer film). For the multilayer film, a spin-valve film is commonly used. The spin-valve film has a free layer where its magnetization direction is changed relative to an external magnetic field, a first pinned layer where its magnetization direction is fixed relative to the external magnetic field, and a spacer layer positioned between the free layer and the first pinned layer. The spacer layer is a nonmagnetic layer that generates a magneto-resistive effect. The multilayer film further has a second pinned layer that fixes the magnetization direction of the first pinned layer and an antiferromagnetic layer that fixes the magnetization of the second pinned layer. The gap between the two magnetic shield layers is referred to as a read gap. In order to enhance the recording density of the magnetic recording medium, particularly the linear recording density, which is the recording density in the down track direction, it is effective to reduce the read gap.

U.S. Pat. No. 7,952,839 discloses an MR element that is provided with an antiferromagnetic layer recessed from the air bearing surface (ABS). The MR element has an inner shield layer positioned between the two magnetic shield layers. The inner shield layer is disposed on the magnetic shield layer adjacent to the antiferromagnetic layer, and faces the ABS. A nonmagnetic conductive layer (cap layer) facing the ABS is disposed between the inner shield layer and the first pinned layer. The antiferromagnetic layer makes contact with the back surface of the inner shield layer viewed from the ABS, but does not face the ABS. The second pinned layer is disposed on the antiferromagnetic layer, and, similar to the antiferromagnetic layer, the second pinned layer does not face the ABS. A portion of the first pinned layer extends to the ABS on the nonmagnetic conductive layer.

U.S. Pat. No. 8,711,528 discloses an MR element where an antiferromagnetic layer is recessed from an ABS. The MR element has an inner shield layer positioned between two magnetic shield layers. The inner shield layer is disposed on the magnetic shield layer adjacent to the antiferromagnetic layer, and faces the ABS. The second pinned layer and the first pinned layer extend to the ABS on the magnetic shield layer.

In these MR elements, because the inner shield layer is disposed on the ABS instead of the antiferromagnetic layer, it is easy to reduce the read gap. Due to this, high-frequency characteristics and bit error rate are also improved. Since the antiferromagnetic layer is away from the ABS, it is difficult a sense current to pass, and the thermostability of the antiferromagnetic layer is improved. Since the antiferromagnetic layer is away from the ABS, corrosion resistance of the antiferromagnetic layer is also improved.

In general, in a spin-valve type MR element, the magnetization direction of the first pinned layer is fixed to a direction orthogonal to the ABS (hereinafter, referred to as the height direction) regardless of the presence of an external magnetic field. A pair of bias layers that apply a bias magnetic field to the free layer are disposed on both sides of the free layer in the cross track direction (the direction orthogonal to the down track direction and the height direction), so as to allow the magnetization direction of the free layer to be oriented in the cross track direction. As a result, the magnetization direction of the free layer is ideally orthogonal to the magnetization direction of the first pinned layer when no external magnetic field exists. When an external magnetic field is applied to the free layer, the magnetization direction of the free layer rotates. The resistance value of the sense current flowing in the multilayer film varies according to the angle of rotation between the magnetization direction of the free layer and that of the first pinned layer. This is referred to as the magneto-resistive effect. Magnetic information recorded in the magnetic recording medium is read based on the magneto-resistive effect of the MR element.

In the MR element described in U.S. Pat. No. 7,952,839, the antiferromagnetic layer makes contact with the inner shield layer, and, in the MR element described in U.S. Pat. No. 8,711,528, the antiferromagnetic layer is electrically connected to the inner shield layer via a conductive seed layer. Consequently, the sense current flowing in the inner shield layer flows in the antiferromagnetic layer. Since the antiferromagnetic layer produces heat by the applied current, the ratio of grains exceeding the blocking temperature (temperature where the bias magnetic field disappears) is increased. A force to fix the magnetization direction of the second pinned layer by the antiferromagnetic layer is weakened, and the magnetization direction of the second pinned layer tends to rotate in the direction of the magnetic field to be applied to the second pinned layer at the moment. As a result, the magnetization direction of the first pinned layer tends to rotate, and is no longer stable in the height direction. A shift of the magnetization direction of the first pinned layer from the height direction causes an increase in noise.

Therefore, the objective of the present invention is to provide a magnetoresistive effect element (MR element) where an antiferromagnetic layer is recessed from the air bearing surface (ABS), and the magnetization direction of the antiferromagnetic layer is stable.

SUMMARY OF THE INVENTION

The MR element of the present invention has a first shield layer; a second shield layer; an inner shield layer that is positioned between the first shield layer and the second shield layer, that makes contact with the first shield layer and faces the ABS; and a multilayer film that is positioned between the first shield layer and the second shield layer. The multilayer film has a free layer where its magnetization direction fluctuates relative to the external magnetic field; a first pinned layer that is positioned closer to the first shield layer than the free layer, and where its magnetization direction is fixed relative to the external magnetic field; a nonmagnetic spacer layer that is positioned between the free layer and the first pinned layer; a second pinned layer that is positioned closer to the first shield layer than the first pinned layer; and an antiferromagnetic layer that is positioned closer to the first shield layer than the second pinned layer, and that is exchange-coupled with the second pinned layer. The antiferromagnetic layer faces the back surface of the inner shield layer viewed from the ABS. The MR element further has an insulating layer that is positioned between the antiferromagnetic layer and the inner shield layer.

The inner shield layer is electrically insulated from the antiferromagnetic layer by the insulating layer. Consequently, it becomes difficult for a current to flow from the inner shield layer to the antiferromagnetic layer. Joule heat in the antiferromagnetic layer is suppressed, and the magnetization directions of the first pinned layer and the second pinned layer become stabilized.

The above-mentioned and other objectives, characteristics and advantages become clear from the explanations below when referring to the attached drawings illustrating the present invention.

DETAILED DESCRIPTION OF THE INVENTION

A magneto-resistive effect element (MR element) relating to the embodiments of the present invention, and embodiments of a magnetic head slider using the MR element, are explained hereafter with reference to the drawings.

Figure 1:
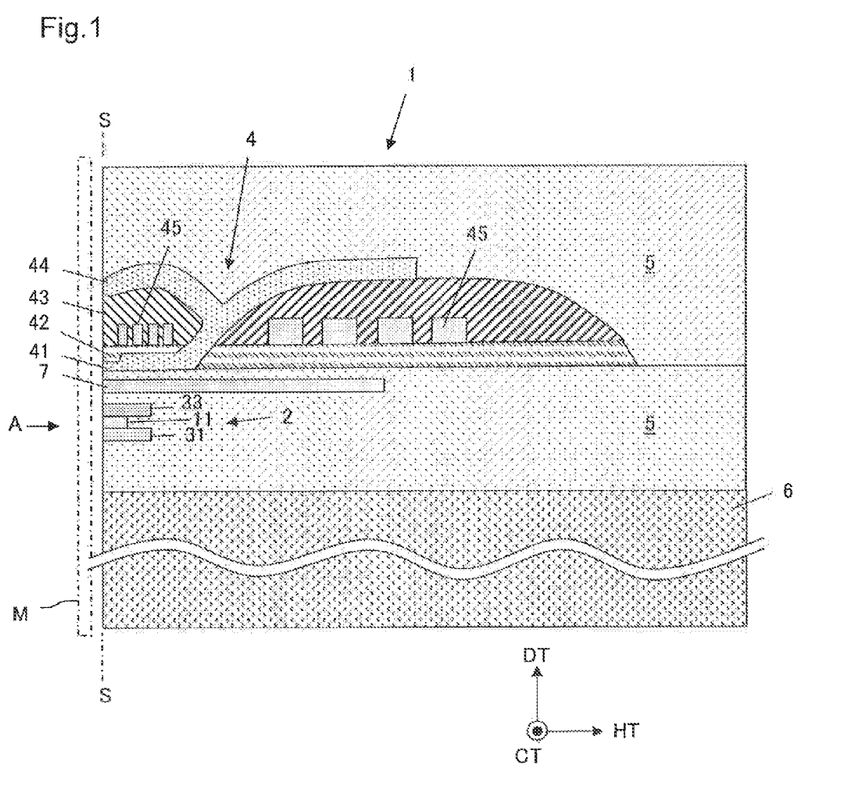
FIG. 1 is a conceptual cross-sectional view of a magnetic head slider relating to one embodiment of the present invention.
Figure 2:
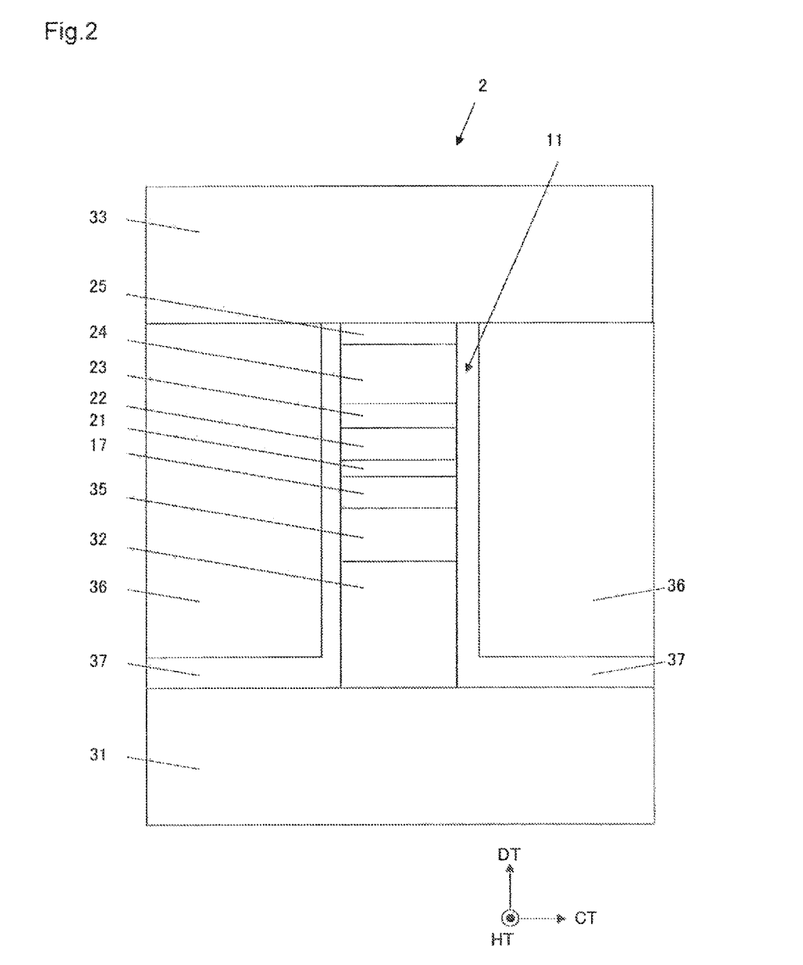
FIG. 2 is a side view of a magneto-resistive effect element viewed from Direction A in FIG. 1.
Figure 3:
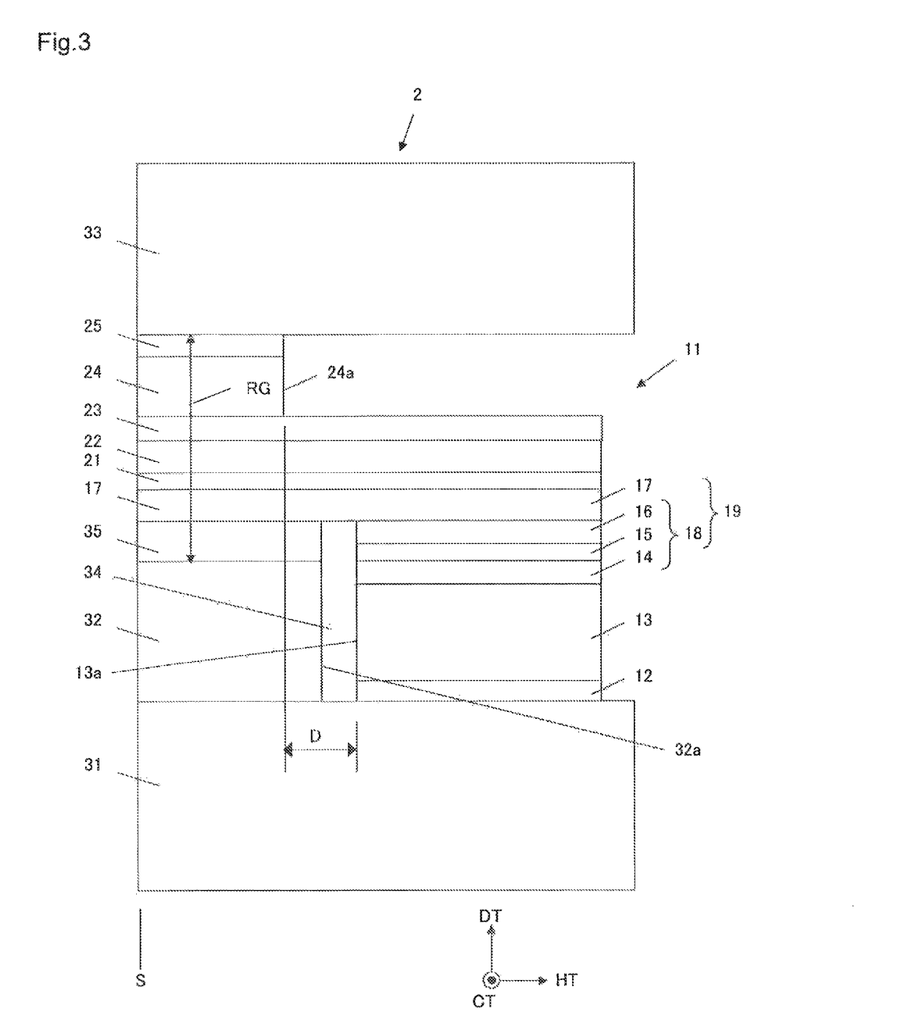
FIG. 3 is a cross-sectional view of the magneto-resistive effect element viewed from the same direction as FIG. 1.

FIG. 1 shows a main portion sectional view of a magnetic head slider 1 relating to one embodiment of the present invention. The magnetic head slider 1 has a substrate 6, a magneto-resistive effect element (MR element) 2 formed over the substrate 6, and a recording part 4 formed over the substrate 6. FIG. 2 is a side view of the MR element 2 viewed from the direction A of FIG. 1, i.e., shows a configuration of the MR element 2 on the air bearing surface S. FIG. 3 shows a cross-sectional view of the MR element 2 viewed from the same direction as FIG. 1. The air bearing surface S is a surface opposite to a magnetic recording medium (hard disk) M of the magnetic head slider 1. First, with reference to FIGS. 2 and 3, the configuration of the MR element 2 is explained.

The MR element 2 has a spin valve-type multilayer film 11; a first shield layer 31 and second shield layer 33 that are positioned at both sides of the multilayer film 11 relating to a down track direction DT; and a pair of bias layers 36 that are established at both sides of the multilayer film 11 relative to a cross track direction CT. The multilayer film 11 is positioned between the first shield layer 31 and the second shield layer 33. The first shield layer 31 is closer to the substrate 6 than the second shield layer 33.

The multilayer film 11 has a free layer 24 where its magnetization direction varies relative to the external magnetic field; a first pinned layer 22 where its magnetization direction is fixed relative to the external magnetic field; and a spacer layer 23 that is positioned between the free layer 24 and the first pinned layer 22. The free layer 24 and the first pinned layer 22 are made from CoFe, and may contain Ni. The free layer 24 and the first pinned layer 22 may be made from a multilayer structure of magnetic films such as CoFe, NiFe and CoFeB. Also, a nonmagnetic layer may be included between these magnetic layers as long as the nonmagnetic layer does not cut off the magnetic coupling. The spacer layer 23 can be formed from various nonmagnetic layers that attain magneto-resistive effects, such as copper, aluminum oxide, gallium oxide, magnesium oxide or zinc oxide. A protective layer 25 for protecting the multilayer film 11 is formed between the free layer 24 and the second shield layer 33. The protective layer 25 is formed from a multilayer film made from Ta, Ru and the like.

Further, the multilayer film 11 has a second pinned layer 19 that is positioned closer to the first shield layer 31 than the first pinned layer 22, and that fixes the magnetization direction of the first pinned layer 22. The second pinned layer 19 is formed, for example, from CoFe. A Ru layer 21 is disposed between the first pinned layer 22 and the second pinned layer 19, and the first pinned layer 22 and a second part 17 (described later) of the second pinned layer 19 are exchange-coupled via the Ru layer 21.

The multilayer film 11 further has an antiferromagnetic layer 13 that is positioned closer to the first shield layer 31 than the second pinned layer 19, and that is exchange-coupled with the second pinned layer 19. The antiferromagnetic layer 13 faces the back surface 32a of the inner shield layer 32 (described later) viewed from the air bearing surface S, and is not on the air bearing surface S. The antiferromagnetic layer 13 is formed from IrMn. The antiferromagnetic layer 13 may be also formed from FeMn, NiMn, PtMn or PdPtMn. The second pinned layer 19 makes contact with the antiferromagnetic layer 13, and is magnetized in the height direction HT. A seed layer 12 is disposed between the antiferromagnetic layer 13 and the first shield layer 31. The seed layer 12 is composed of a bilayer film with a Ru layer making contact with the first shield layer 31 and a Ta layer making contact with the antiferromagnetic layer 13. The seed layer 12 is disposed in order to obtain excellent exchange coupling between the antiferromagnetic layer 13 to be laminated onto it and the second pinned layer 19.

The first shield layer 31 and the second shield layer 33 are formed from, for example, NiFe (permalloy). The first shield layer 31 and the second shield layer 33 shield the external magnetic field to be emitted from bits other than those subject to reading, and allow the free layer 24 to detect only the magnetic field to be emitted from the bits subject to reading.

The MR element 2 further has the inner shield layer 32. The inner shield layer 32 is positioned between the first shield layer 31 and the second shield layer 33, and faces the air bearing surface S. The inner shield layer 32 is formed from, for example, NiFe, and makes contact with the first shield layer 31. Therefore, the inner shield layer 32 functions as a magnetic shield of the multilayer film 11 along with the first shield layer 31. A buffer layer may be provided between the first shield layer 31 and the inner shield layer 32. A read gap RG is regulated as the gap between the inner shield layer 32 and the second shield layer 33. In the MR element 2 of the present embodiment, the read gap RG is reduced compared to a conventional MR element where the antiferromagnetic layer 13 is positioned on the air bearing surface S.

IrMn that configures the antiferromagnetic layer 13 tends to be deteriorated by heat, and, the vicinity of the air bearing surface S tends to be at a high temperature because of the flow of the sense current. Since the antiferromagnetic layer 13 of the present embodiment is recessed from the air bearing surface S, it is difficult to be exposed to high temperature due to the electric current. Further, the antiferromagnetic layer 13 tends to be corroded if it faces the air bearing surface S. Since the antiferromagnetic layer 13 of the present embodiment is protected by the inner shield layer 32, the reliability of the MR element 2 is improved.

The inner shield layer 32 has a greater film thickness (dimensions in the down track dimension DT) than the antiferromagnetic layer 13. As a result, the second pinned layer 19 protrudes toward the first shield layer 31 or is depressed at a position opposite to the antiferromagnetic layer 13. The second pinned layer 19 has a first part 18, which is a protrusion part, and a second part 17 with the shape of a flat film. The first part 18 faces the back surface 32a of the inner shield layer 32. The second part 17 makes contact with the first part 18 in the down track direction DT, and extends to the air bearing surface S between the first part 18 and the first pinned layer 22, and between the inner shield layer 32 and the first pinned layer 22. The first part 18 is composed of a first layer 14, a Ru layer 15 and a second layer 16. The first layer 14 makes contact with the antiferromagnetic layer 13, and is exchange-coupled with the antiferromagnetic layer 13. The second layer 16 makes contact with the second part 17, and is magnetically integrated with the second part 17. The layer thickness of the Ru layer 15 is approximately 0.8 nm, and the magnetization direction of the second layer 16 is fixed to an antiparallel orientation of the magnetization direction of the first layer 14. Since the first part 18 has the first layer 14 and the second layer 16 that are magnetized in antiparallel orientation with each other, the magnetic moment of the entire first part 18 is suppressed.

A cap layer 35 is disposed between the second part 17 of the second pinned layer 19 and the inner shield layer 32. The cap layer 35 is not particularly restricted as long as it is a nonmagnetic metallic layer.

In the present embodiment, the cap layer 35 is composed of a bilayer film with a Ta layer making contact with the inner shield layer 32 and a Ru layer making contact with the second part 17 of the second pinned layer 19.

A nonmagnetic insulating layer 34 is disposed between the antiferromagnetic layer 13 and the inner shield layer 32, and between the first part 18 of the second pinned layer 19 and the inner shield layer 32. The nonmagnetic insulating layer 34 can be formed from aluminum oxide, silicon oxide, magnesium oxide, nickel oxide, manganese oxide, tantalum oxide, cobalt oxide, iron oxide or chrome oxide. It is preferable that the film thickness of the nonmagnetic insulating layer 34 is approximately 1 nm. The nonmagnetic insulating layer 34 has two characteristics: it is both "nonmagnetic" and "non-conductive".

Effects because the nonmagnetic insulating layer 34 is "nonmagnetic" are as follows: The nonmagnetic insulating layer 34 shields or weakens magnetic coupling of the first portion 18 of the second pinned layer 19 with the inner shield layer 32, and the antiferromagnetic layer 13 with the inner shield layer 32. As described later, it enables the magnetization directions of the second pinned layer 19 and the first pinned layer 22 to be stabilized. As a result of this, as described later with reference to FIGS. 7 and 8, a variation of outputs relative to a change (fluctuation) in offset distance D of the antiferromagnetic layer 13 from the back surface 24a of the free layer 24, and variations of mean values of asymmetry, are suppressed.

Effects because of the nonmagnetic insulating layer 34 being "non-conductive", i.e., having electric insulation properties, are as follows:

(1) The occurrence of magnetic coupling based upon Ruderman Kittel Kasuya Yosida (RKKY) interaction between the first part 18 of the second pinned layer 19 and the inner shield layer 32, or between the antiferromagnetic layer 13 and the inner shield layer 32, is prevented. The RKKY interaction is one type of exchange coupling, and it occurs when magnetic materials make contact with each other via a metallic film. Therefore, the nonmagnetic insulating layer 34 prevents the occurrence of the RKKY interaction. It becomes difficult for the inner shield layer 32 to be magnetized by the antiferromagnetic layer 13 due to this, as well, and the magnetization directions of the second pinned layer 19 and the first pinned layer 22 are stabilized. As a result, as described later with reference to FIGS. 7 and 8, a variation of outputs relative to a change (fluctuation) in the offset distance D of the antiferromagnetic layer 13 from the back surface 24a of the free layer 24 and variations of mean values of asymmetry are suppressed.

(2) The nonmagnetic insulating layer 34 prevents the sense current flowing in the inner shield layer 32 from flowing (leaking) into the antiferromagnetic layer 13. The antiferromagnetic layer 13 typified by IrMn generates heat because the sense current flows through, and the temperature of the element exceeds the blocking temperature of the grain. When the temperature of the element exceeds the blocking temperature of the grain, a bias magnetic field or their antiferromagnetic properties will be lost. As a result, a force to fix the magnetization direction of the second pinned layer 19 making contact with the antiferromagnetic layer 13 weakens. The magnetization direction of the second pinned layer 19 becomes susceptible to the external magnetic field, and the magnetization direction that is ideally orientated toward the height direction easily rotates to the cross track direction. As a result, the magnetization direction of the first pinned layer 22 that is exchange-coupled with the second pinned layer 19 also rotates to the same direction as the second pinned layer 19, and it leads to an increase of noise of the MR element. The sense current to be applied into the antiferromagnetic layer 13 is suppressed by the nonmagnetic insulating layer 34, and noise of the MR element can be suppressed.

Thus, the nonmagnetic insulating layer 34 of the present embodiment has both "nonmagnetic" and "non-conductive" charatceristics, but it may have only either one of the characteristics. The nonmagnetic insulating layer 34 may be a nonmagnetic layer or insulating non-conductive layer, and both cases can provide the above effects.

With reference to FIG. 2, a pair of bias layers 36 is formed from CoPt, CoCrPt or the like. Each bias magnetic field application layer 36 applies a bias magnetic field to the free layer 24, and magnetizes the free layer 24 into a single magnetic domain. When there is no external magnetic field, the magnetization direction of the free layer 24 is oriented toward the cross track direction CT by the bias magnetic field. A pair of insulating layers 37 for preventing bypass of the sense current are disposed between the pair of the bias layers 36 and the multilayer film 11.

The first shield layer 31 and the second shield layer 33 also function as respective electrodes. Due to voltage to be applied between the first shield layer 31 and the second shield layer 33, the sense current flows into the multilayer film 11. When the external magnetic field to be emitted from a magnetic recording medium M is applied to the free layer 24, the magnetization direction of the free layer 24 rotates to a predetermined direction at a predetermined angle within the film surface of the free layer 24 according to the orientation and intensity of the external magnetic field. The magnetization direction of the free layer 24 forms a relative angle according to the orientation and intensity of the external magnetic field relative to the magnetization direction of the first pinned layer 22, and spin-dependent scattering of conductive electrons varies according to the relative angle, and a magneto-resistive change occurs. A magnetic field from the magnetic recording medium M at the position opposite to the multilayer film 11 changes as the magnetic recording medium M rotates. A change of the magnetic field is detected as a change of electrical resistance of the sense current based upon the magneto-resistive effect. The MR element 2 reads magnetic information written into the magnetic recording medium M by utilizing this principle.

The multilayer film 11 can be made using a conventional method such as sputtering. A method for making the inner shield layer 32, the antiferromagnetic layer 13, the second pinned layer 19, the nonmagnetic insulating layer 34 and the cap layer 35 is described with reference to FIGS. 4A to 4E.

Figure 4A:
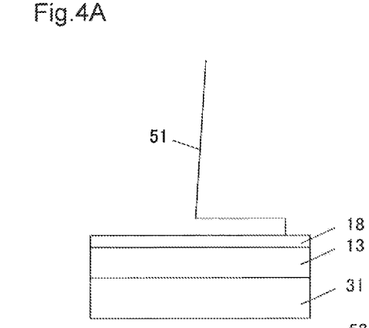
FIGS. 4A to 4E are conceptual diagrams explaining a method for manufacturing a magneto-resistive effect element (MR element)

First, as shown in FIG. 4A, the first shield layer 31 is made using a plating method, and the seed layer 12 (not shown), the antiferromagnetic layer 13, and the first part 18 of the second pinned layer 19 are sequentially formed on the first shield layer 31 using a sputtering method. Next, a photoresist 51 is made on the first part 18 of the second pinned layer 19. The photoresist 51 will not be disposed in a region where the inner shield layer 32 is made.

Figure 4B:
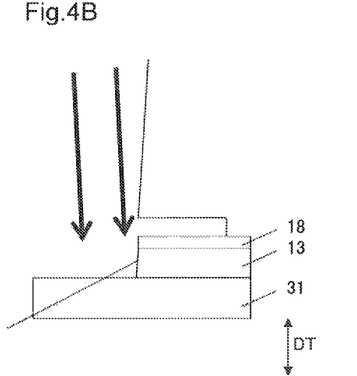

Next, as shown in FIG. 4B, the seed layer 12, the antiferromagnetic layer 13 and the first part 18 of the second pinned layer 19 are removed by ion milling. The portions of these layers covered with the photoresist 51 are not removed. An ion beam is applied from a direction that is nearly perpendicular to the substrate 6 (down track direction DT). It is desirable that a side surface 52 of the antiferromagnetic layer 13 and the first part 18 of the second pinned layer 19 formed by ion milling are slightly inclined relative to an axis that is perpendicular to the substrate 6.

Figure 4C:
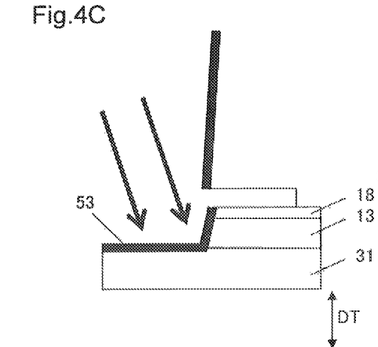

Next, as shown in FIG. 4C, a nonmagnetic insulating layer 53, which will become a nonmagnetic insulating layer 34, is formed by sputtering. Slightly inclining the entering direction of ion beam relative to an axis that is perpendicular to the substrate 6 enables a nonmagnetic insulating layer 53 to be formed also on the side surface 52 of the antiferromagnetic layer 13 and the first part 18 of the second pinned layer 19.

Figure 4D:
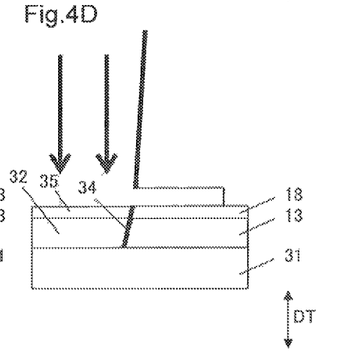

Next, as shown in FIG. 4D, the nonmagnetic insulating layer 53 deposited onto the first shield layer 31 is removed by ion milling. The nonmagnetic insulating layer 53 deposited on the side surface 52 of the antiferromagnetic layer 13 and the first portion 18 of the second pinned layer 19 is slightly thinned, and the residual nonmagnetic insulating layer 53 becomes the nonmagnetic insulating layer 34. Incidence of the ion beam from a direction that is nearly perpendicular to the substrate 6 results in a remaining portion of the film thickness of the nonmagnetic insulating layer deposited onto the side surface 52 of the antiferromagnetic layer 13 and the first part 18 of the second pinned layer 19. Next, the inner shield layer 32 and the cap layer 35 are formed using a sputtering method. Since the nonmagnetic insulating layer 34 deposited on the first shield layer 31 has been removed in advance, the inner shield layer 32 makes contact with the first shield layer 31, and is integrated with the first shield layer 31. The buffer layer may be provided between the first shield layer 31 and the inner shield layer 32.

Figure 4E:
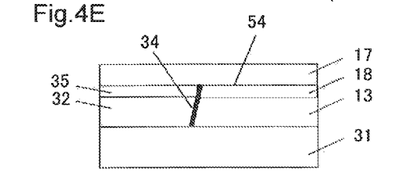

Next, the photoresist 51 is removed as shown in FIG. 4E, and a surface 54 of the cap layer 35 and the first part 18 of the second pinned layer 19 are planarized by milling. Then, a second part 17 of the second pinned layer 19 is formed on the cap layer 35 and the first part 18 of the second pinned layer 19 using a sputtering method. The second part 17 of the second pinned layer 19 makes contact with a second layer 16 of the first part 18, and is integrated with the second layer 16.

With reference to FIG. 1 again, the recording part 4 is disposed above the multilayer film 11 via an interelement shield layer 7 formed using a sputtering method. The recording part 4 has a configuration for so-called perpendicular magnetic recording. A magnetic pole layer for writing is composed of a main magnetic pole layer 41 and an auxiliary magnetic pole layer 44. These magnetic pole layers are formed using a frame plating method. The main magnetic pole layer 41 is formed from an alloy made from any of two or three of Ni, Fe and Co, and extends in the height direction HT. A coil layer 45 extending on the gap layer 42 made from an insulating material is wound around the main magnetic pole layer 41. The coil layer 45 is formed using a frame plating method. Magnetic flux is induced to the main magnetic pole layer 41 by the coil layer 45. This magnetic flux is guided inside the main magnetic pole layer 41, and is emitted toward the magnetic recording medium M from the air bearing surface S. The auxiliary magnetic pole layer 44 is a magnetic layer that is magnetically coupled with the main magnetic pole layer 41. The auxiliary magnetic pole layer 44 is formed from an alloy made from any of two or three of Ni, Fe and Co. The auxiliary magnetic pole layer 44 is disposed by branching from the main magnetic pole layer 41, and is opposite to the main magnetic pole layer 41 on the air bearing surface S via the gap layer 42 and the coil insulating layer 43.

The free layer 24 and the first pinned layer 22 may be disposed upside-down in the down track direction DT relating to the spacer layer 23. Specifically, the free layer 24, the spacer layer 23, the first pinned layer 22, the second pinned layer 19 and the antiferromagnetic layer 13 may be laminated in this order from the first shield layer 31 toward the second shield layer 33. The inner shield layer 32 makes contact with the second shield layer 33, and the antiferromagnetic layer 13 is isolated from the air bearing surface S via the inner shield layer 32.

Figure 5:
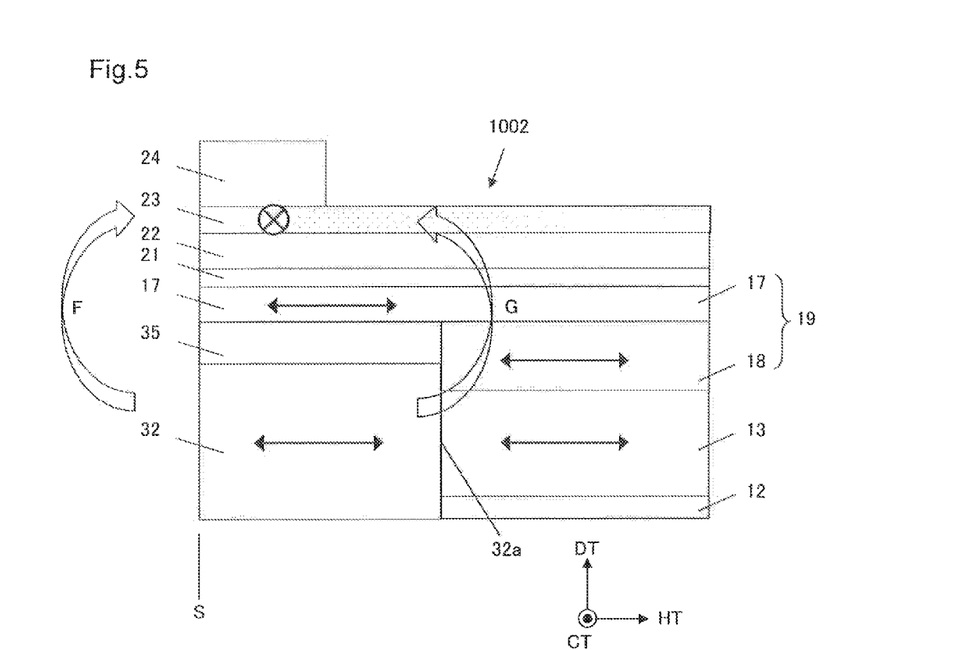
FIG. 5 is a conceptual diagram showing a problem when there is no nonmagnetic insulating layer.

FIG. 5 shows a side view of a magneto-resistive effect element (MR element) 1002 where no nonmagnetic insulating layer 34 is disposed. When the inner shield layer 32 directly makes contact with the antiferromagnetic layer 13 and the second pinned layer 19, the inner shield layer 32 is exchange-coupled with the antiferromagnetic layer 13, and is magnetized to the height direction HT. The inner shield layer 32 is magnetized also by the second pinned layer 19, and is further strongly magnetized in the height direction HT. A magnetic field leaks from the magnetized inner shield layer 32. This magnetic field leaks from the air bearing surface S and the back surface 32a of the inner shield layer 32 (Arrows F and G). The magnetic fields F and G that leak from the inner shield layer 32 function so as to bend the magnetization direction of the free layer 24 from the cross track direction CT to the height direction HT. Consequently, the magnetization direction of the free layer 24 rotates from the cross track direction CT to the height direction HT under the situation without an external magnetic field from the magnetic recording medium M.

Figure 6:
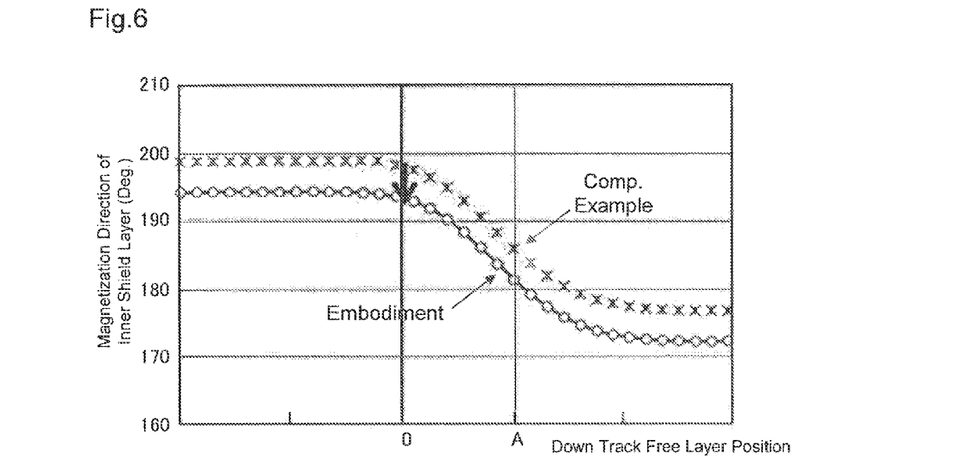
FIG. 6 is a graph showing a relationship between the magnetization direction of the inner shield layer and the position of the free layer.

FIG. 6 is a graph where the magnetization directions of the inner shield layer 32 are indicated as a function of the positions of the free layer 24 in embodiments where the nonmagnetic insulating layer 34 is disposed and in comparative examples where no nonmagnetic insulating layer 34 is disposed. While a magnetic recording medium with 2 bits that are magnetized in opposite directions from each other was moved in the down track direction DT, the magnetization direction of the inner shield layer 32 was obtained by simulation. The horizontal axis indicates positions of the free layer 24 in the down track direction DT, and the bit is switched at "A". In other words, the external magnetic fields emitted from the two bits offset each other at "A", and the external magnetic field to be applied to the free layer 24 will become zero. The vertical axis indicates the magnetization direction of the inner shield layer 32. The angles: 0° and 180° indicate the cross track direction CT, and the angles: 90° and 270° indicate the height direction HT. The magnetization direction of the inner shield layer 32 is orientated toward the cross track direction CT by the bias magnetic field when there is no external magnetic field, and the magnetization direction is rotated in the height direction HT as the external magnetic field increases (i.e., as separating from "A"), the magnetization direction is rotated in the height direction HT. The magnetization direction of the inner shield layer 32 is ideally orientated toward 180° under the situation without an external magnetic field, and as the external magnetic field increases, symmetrical behavior is demonstrated with 180° as a center. In the comparative example, the magnetization direction of the inner shield layer 32 is in the vicinity of 185° at "A", and fluctuates between approximately 198° and approximately 172° with the vicinity of 185° as a center. This indicates that the exchange coupling with the antiferromagnetic layer 13 results in an application of a bias in the magnetization direction of the inner shield layer 32, and in a rotation of approximately 5° relative to 180°, which is the ideal magnetization direction. In the meantime, in the embodiments, the exchange coupling between the inner shield layer 32 and the antiferromagnetic layer 13 is shielded by the nonmagnetic insulating layer 34. The inner shield layer 32 receives a magnetic field only from the bias magnetic field application layer 36, and the magnetization direction without any external magnetic field is oriented toward substantially 180°.

Figure 7:
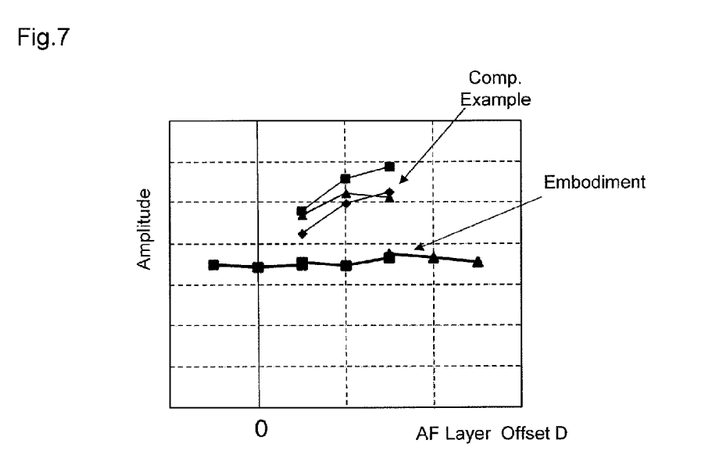
FIG. 7 is a graph showing a relationship between an output of the magneto-resistive effect element and an offset distance of an antiferromagnetic layer.

FIG. 7 is a graph showing a relationship between the offset distance of the antiferromagnetic layer 13 from the back surface of the free layer 24 and an output of the MR element 2. The horizontal axis indicates the offset distance of the antiferromagnetic layer 13 from the back surface of the free layer 24. A side surface 13a of the antiferromagnetic layer 13 is modeled as a parallel plane to the air bearing surface S. As shown in FIG. 3, the offset distance is defined as distance D in the height direction HT between the side surface 13a of the antiferromagnetic layer 13 at the air bearing surface S side and the back surface 24a of the free layer 24 at the opposite side from the air bearing surface S. The offset distance D=0 indicates that the side surface 13a of the antiferromagnetic layer 13 at the air bearing surface S side is matched with the back surface 24a of the free layer 24. The right side from "0" on the horizontal axis indicates that the antiferromagnetic layer 13 is recessed from the back surface 24a of the free layer 24. In the comparative example where no nonmagnetic insulating layer 34 is disposed, variations of the outputs relative to the change of the offset distance D are great. In the meantime, in the embodiment where the antiferromagnetic insulating layer 34 is disposed, the variations of the outputs relative to the change of the offset distance D are small.

Figure 8:
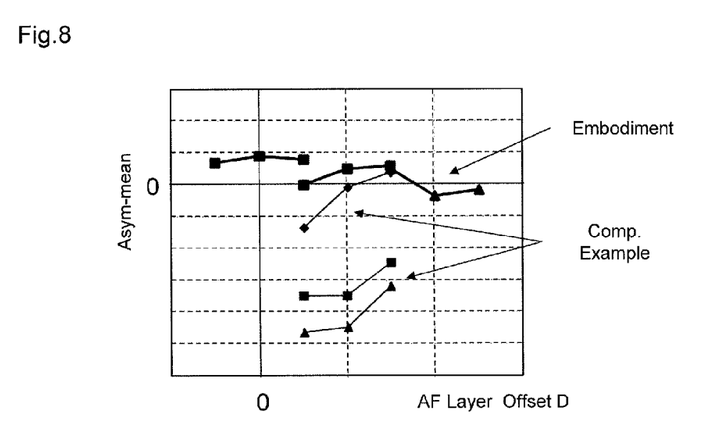
FIG. 8 is a graph showing a relationship between the asymmetry of the magneto-resistive effect element and the offset distance of the antiferromagnetic layer.

FIG. 8 is a graph showing a relationship between the offset distance D of the antiferromagnetic layer 13 from the back surface 24a of the free layer 24, and mean values for asymmetry. The asymmetry is obtained with $(A-B)/(A+B)\times 100(\%)$ when a height (absolute value) of a vertex of the output voltage waveform at the plus side is A and a height (absolute value) of the vertex at the minus side is B. The mean value of the asymmetry is a value where these asymmetries are averaged out relative to all vertices. The horizontal axis, as similar to FIG. 7, indicates the offset distance D of the side surface 13a of the antiferromagnetic layer 13 at the air bearing surface S side from the back surface 24a of the free layer 24, and the vertical axis indicates the mean value for the asymmetry. The shape of the antiferromagnetic layer 13 and the definition of the offset distance D are the same as those in FIG. 7. In the comparative example where no nonmagnetic insulating layer 34 is disposed, variations of the mean values for the asymmetries relative to the change of the offset distance D are great. In the meantime, in the embodiment where the nonmagnetic insulating layer 34 is disposed, the variations of the mean values for asymmetry relative to the change of the offset distance D are small. An absolute value of the mean values of asymmetry is also greater in the present embodiment than that in the comparative example.

Thus, disposing of the nonmagnetic insulating layer 34 between the antiferromagnetic layer 13 and the inner shield layer 32 results in reduction of a variation of outputs of the MR element 2 and reduction of a variation of mean values of asymmetry. The disposing of the nonmagnetic insulating layer 34 results in reduction of noise of the outputs of the MR element 2.

The cap layer 35 has an effect to suppress magnetic magnetization of the inner shield layer 32 to the height direction HT by the second part 17 of the second pinned layer 19. Since the magnetization component of the inner shield layer 32 in the height direction HT becomes smaller, a leakage magnetic field that enters into the free layer 24 becomes smaller. Since the nonmagnetic insulating layer 34 is disposed in the present embodiment, even if insulation of the cap layer 35 is insufficient, magnetization of the inner shield layer 32 can be suppressed. As a result, the film thickness of the cap layer 35 can be reduced, and the film thickness of the inner shield layer 32 can be increased. This enables the further reduction of the read gap RG.

Figure 9:
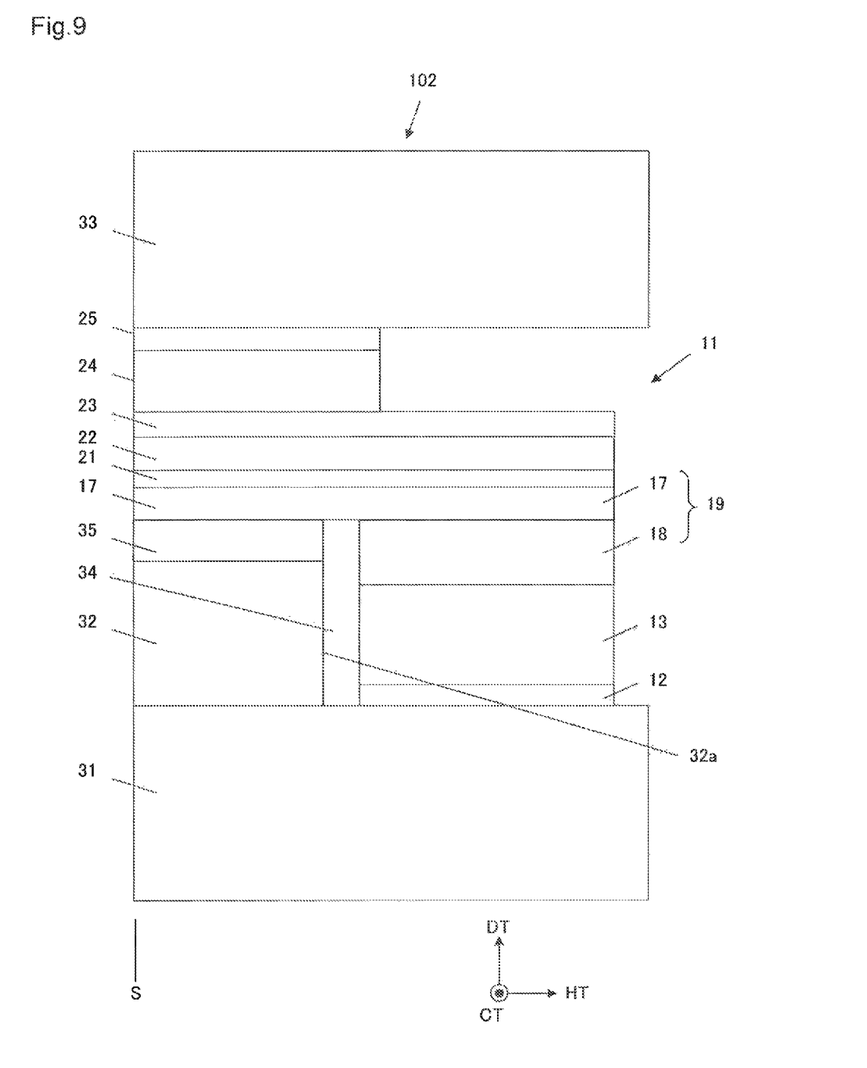
FIG. 9 is a cross-sectional view of the magneto-resistive effect element relating to another embodiment of the present invention.

FIG. 9 is a similar diagram to FIG. 3 showing another embodiment 102 of the MR element of the present invention. Elements that are the same as those in the embodiment shown in FIG. 3 are referenced with the same symbols in FIG. 3. In the present embodiment, the first part 18 of the second pinned layer 19 has a single layer configuration. In other words, the Ru layer 15 and the second layer 16 are omitted. In the present embodiment, compared to the embodiment shown in FIG. 3, the configuration of the second pinned layer 19 and the manufacturing process thereof are simplified.

Figure 10:
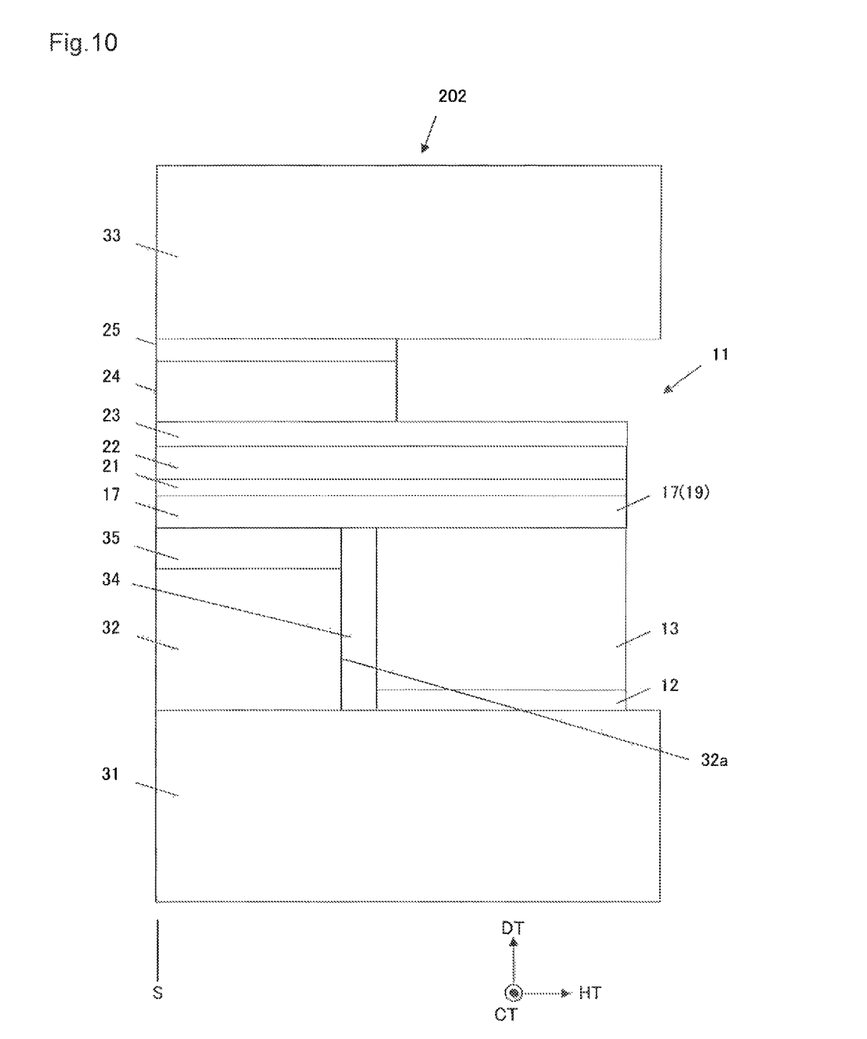
FIG. 10 is a cross-sectional view of the magneto-resistive effect element relating to another embodiment of the present invention.

FIG. 10 is a similar diagram to FIG. 3 showing another embodiment 202 of the MR element of the present invention. Elements that are the same as those in the embodiment shown in FIG. 3 are referenced with the same symbols in FIG. 3. In the present embodiment, the first part 18 of the second pinned layer 19 is not disposed, and the second pinned layer 19 has a flat film shape as a whole. In the present embodiment, the back surface 32a of the inner shield layer 32 faces only the antiferromagnetic layer 13. Therefore, the nonmagnetic insulating layer 34 is disposed only between the antiferromagnetic layer 13 and the inner shield layer 32 except for the seed layer 12. In the present embodiment, compared to the embodiment shown in FIG. 3, the configuration of the second pinned layer 19 and the manufacturing process thereof are simplified. Further, since the film thickness of the antiferromagnetic layer 13 can be sufficiently secured, the blocking temperature becomes higher and the thermal tolerability of the antiferromagnetic layer 13 is improved. As a result, even if the antiferromagnetic layer 13 reaches a high temperature because of the leakage of the sense current into the antiferromagnetic layer 13 or the like, the magnetization directions of the second pinned layer 19 and the first pinned layer 22 are stabilized.

The film thickness of the inner shield layer 32 and that of the antiferromagnetic layer 13 are not directly related, but these can be independently determined, respectively. The inner shield layer 32 can be determined according to necessary film thickness of the second pinned layer 19, and it enables minimization of the read gap RG. Therefore, in the embodiment shown in FIG. 3, it is easier to reduce the read gap RG than the embodiments shown in FIGS. 9 and 10. Further, the Ru layer 15 functions as a protective film of the antiferromagnetic layer 13 at the time of manufacturing, and deterioration of the antiferromagnetic layer 13 can be prevented. The antiferromagnetic layer 13 may protrude more toward the second pinned layer 19 than the inner shield layer 32.

Figure 11:
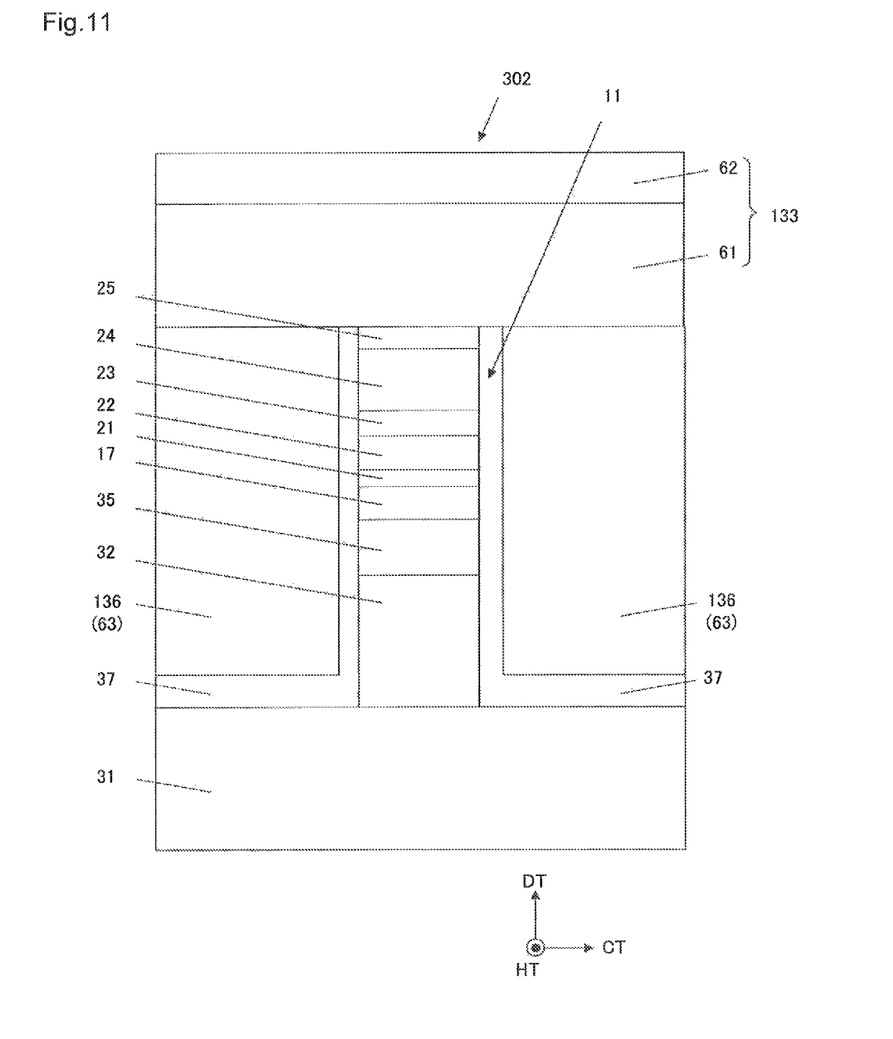
FIG. 11 is a side view of the magnetoresistive effect element relating to another embodiment of the present invention.

FIG. 11 is a similar diagram to FIG. 2 showing another embodiment 302 of the MR element of the present invention. Elements that are the same as those in the embodiment shown in FIG. 2 are referenced with the same symbols in FIG. 2. The present embodiment is characterized by the configuration of the second shield layer 133 and the bias magnetic field application layer 136, and it can be combined with other embodiments described in the present specification. The second shield layer 133 is composed of a soft magnetic layer 61 and an anisotropy application layer 62 that provides anisotropy to the soft magnetic layer 61. The anisotropy application layer 62 is positioned at the opposite side of the bias magnetic field application layer 136 across the soft magnetic layer 61. The soft magnetic layer 61 is formed from, for example, NiFe, and the anisotropy application layer 62 can be formed from an antiferromagnetic body, such as IrMn, PtMn, RuRhMn or FeMn. The anisotropy application layer 62 can be formed from a hard magnetic body, such as CoPT, CoCrPt or FePt. The soft magnetic layer 61 is exchange-coupled with the anisotropy application layer 62, and is magnetized in the cross track direction CT. At least a portion of the bias magnetic field application layer 136 is formed from a soft magnetic layer 63, for example, NiFe or the like. The soft magnetic layer 63 of the bias magnetic field application layer 136 makes contact with the soft magnetic layer 61 of the second shield layer 133, and is magnetized to the same orientation as the soft magnetic layer 61 of the second shield layer 133. Consequently, the bias magnetic field application layer 136 can apply a bias magnetic field in the cross track direction CT to the free layer 24 as similar to the bias magnetic field application layer 36 (see FIG. 2) composed of an antiferromagnetic material. The soft magnetic layer 63 of the bias magnetic field application layer 136 may be exchange-coupled with the soft magnetic layer 61 of the second shield layer 133 via the Ru layer. This enables magnetization of the soft magnetic layer 63 of the bias magnetic field application layer 136 to be magnetized to an anti-parallel orientation with the soft magnetic layer 61 of the second shield layer 133. Since the bias magnetic field application layer 136 includes the soft magnetic layer 63, it has an effect to shield a magnetic field leaking from an adjacent track. Therefore, the effective track width can be reduced, and a side lobe (a phenomenon where a local maximum point of the output is generated at a position separated from other than the track center in the cross track direction CT) can be prevented at the same time. When the bias magnetic field application layer 136 is formed from a soft magnetic material, it may have a synthetic structure.

Figure 12:
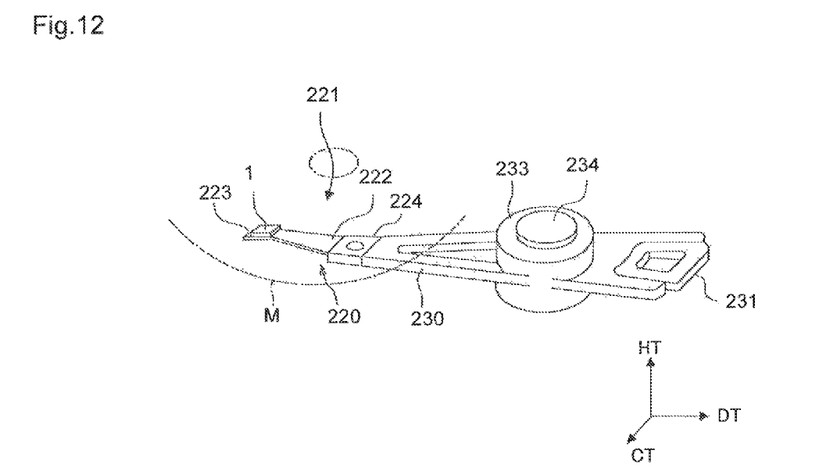
FIG. 12 is a perspective view of a head arm assembly of the present invention.

FIG. 12 is a perspective view of a head gimbal assembly (HGA) 221.

The HGA 221 is provided with the magnetic head slider 1 where the MR element 2 is mounted, and a suspension 220 that elastically supports the magnetic head slider 1. The suspension 220 has a plate spring-state load beam 222 formed from stainless steel, a flexure 223 disposed at one end part of the load beam 222, and a base plate 224 disposed at the other end part of the load beam 222. The magnetic head slider 1 is joined to the flexure 223, and has a moderate degree of freedom due to the flexure 223. A gimbal part (not shown) to maintain the posture of the magnetic head slider 1 constant is disposed at a portion where the magnetic head slider 1 is attached to the flexure 223.

The HGA 221 is attached to the arm 230. The arm 230 moves the magnetic head slider 1 in the cross track direction CT. The base plate 224 is attached to one end of the arm 230. A coil 231 that is a portion of a voice coil motor is attached to the other end part of the arm 230. A bearing 233 is disposed in the intermediate part of the arm 230. The arm 230 is pivotably supported by a shaft 234 mounted to the bearing 233. The arm 230 and the voice coil motor that drives the arm 230 configure an actuator.

Figure 13:
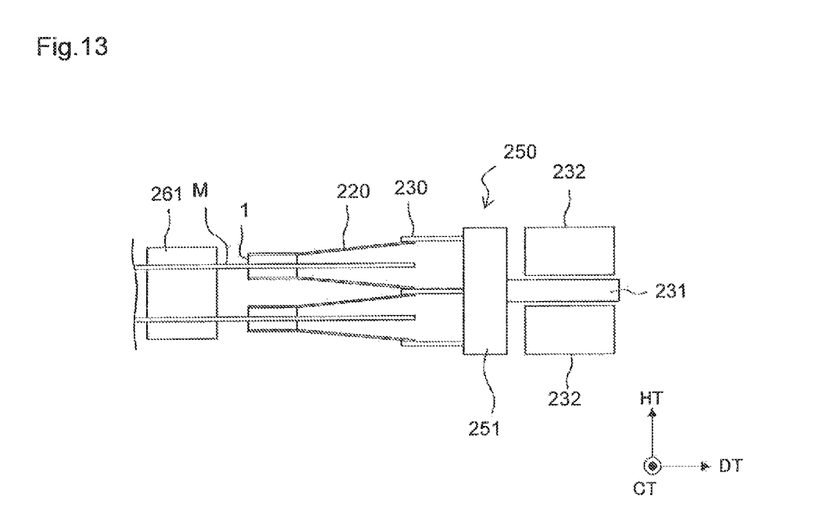
FIG. 13 is a side view of a head stack assembly of the present invention.

FIG. 13 is a side view of the head stack assembly 250. The head stack assembly 250 has a carriage 251 having a plurality of arms 230, and the HGAs 221 attached to each arm 230. The HGAs 221 are mounted to the arms 230 so as to align in the height direction HT at intervals from each other. A pair of permanent magnets 232 are arranged at opposing positions across the coil 231.

Figure 14:
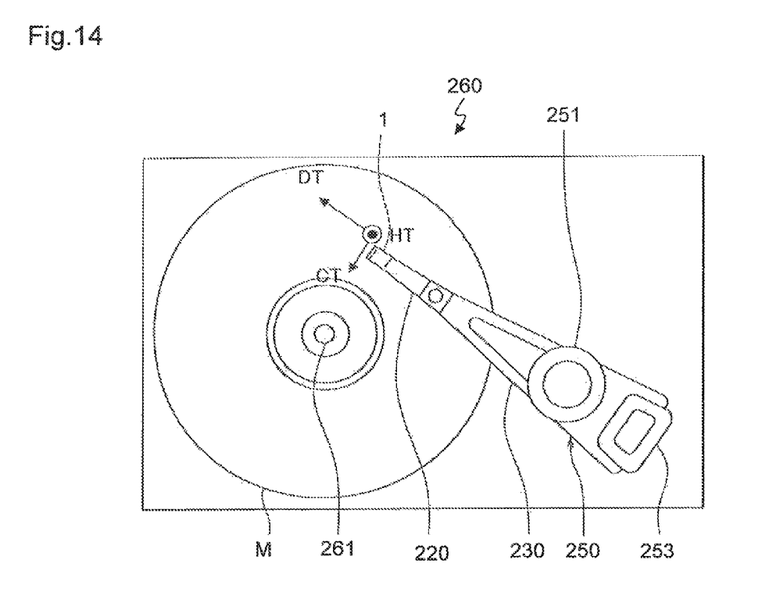
FIG. 14 is a plan view of a magnetic recording apparatus.

FIG. 14 is a plan view of a magnetic recording apparatus. The head stack assembly 250 is incorporated into a magnetic recording apparatus 260. The magnetic recording apparatus 260 has a plurality of magnetic recording media M attached to the spindle motor 261. Two magnetic head sliders 1 opposite to each other across the magnetic recording medium M are arranged in each magnetic recording medium M.

The head stack assembly 250 except for the magnetic head sliders 1 and the actuator configure a positioning device, support the magnetic head sliders 1, and position the magnetic head sliders 1 relative to the magnetic recording media M. The magnetic head sliders 1 are moved in the cross track direction CT of the magnetic recording media M by the actuator, and are positioned relative to the magnetic recording media M, respectively. The magnetic head sliders 1 record information into the magnetic recording media M by the magnetic recording element, and reproduce the information recorded in the magnetic recording media M by the MR element 2.

The preferred embodiments of the present invention were presented and explained in detail, and please understand that these are variously modifiable and correctable as long as not departing from the concept or the scope of attached claims.

What is claimed is:

1. A magneto-resistive effect element (MR element), comprising:
   a first shield layer,
   a second shield layer,
   an inner shield layer that is positioned between the first shield layer and the second shield layer, that faces the first shield layer, and that faces an air bearing surface (ABS), and
   a multilayer film that is positioned between the first shield layer and the second shield layer, wherein
   the multilayer film comprises
      a free layer having a magnetization direction that fluctuates relative to an external magnetic field,
      a first pinned layer that is positioned closer to the first shield layer than the free layer, and having a magnetization direction that is fixed relative to the external magnetic field,
      a nonmagnetic spacer layer that is positioned between the free layer and the first pinned layer,
      a second pinned layer that is positioned closer to the first shield layer than the first pinned layer, and that fixes the magnetization direction of the first pinned layer, and
      an antiferromagnetic layer that is positioned closer to the first shield layer than the second pinned layer, and that is exchange-coupled with the second pinned layer;
   the antiferromagnetic layer faces the back surface of the inner shield layer viewed from the ABS; and
   the MR element comprises an insulating layer between the antiferromagnetic layer and the inner shield layer, wherein the second pinned layer comprises a first part facing the back surface of the inner shield layer and a second part that makes contact with the first part, and that extends to the ABS between the first part and the first pinned layer and between the inner shield layer and the first pinned layer, and
   the insulating layer is positioned between the first part and the inner shield layer, and between the antiferromagnetic layer and the inner shield layer.

2. The MR element according to claim 1, wherein the insulating layer is a nonmagnetic insulating layer.

3. The MR element according to claim 1, wherein the first part comprises
   a first layer that makes contact with the antiferromagnetic layer,
   a second layer that makes contact with the second part, and
   a layer that is positioned between the first layer and the second layer, and that generates-exchange coupling between the first layer and the second layer.

4. The MR element according to claim 1, wherein the insulating layer is made from aluminum oxide, silicon oxide, magnesium oxide, nickel oxide, manganese oxide, tantalum oxide, cobalt oxide, iron oxide or chrome oxide.

5. The MR element according to claim 1, comprising:
   a pair of bias magnetic field application layers that are positioned at both sides of the free layer in the cross track direction, and that include respective soft magnetic layers, wherein
   the second shield layer comprises:
      a soft magnetic layer, and
      an anisotropy application layer that is positioned at an opposite side of the bias magnetic field application layers across the soft magnetic layer of the second shield layer, and that applies anisotropy to the soft magnetic layer of the second shield layer; and
      the soft magnetic layer of the bias magnetic field application layers are magnetized to an orientation that is parallel or anti-parallel to the soft magnetic layer of the second shield layer by the soft magnetic layer of the second shield layer.

6. The MR element according to claim 5, wherein the anisotropy application layer is made from an antiferromagnetic layer.

7. The MR element according to claim 5, wherein the anisotropy application layer is made from a hard magnetic layer.

8. A head gimbal assembly (HGA), comprising:
   a magnetic head slider including the MR element according to claim 1, and
   a suspension that elastically supports the magnetic head slider, wherein
   the suspension comprises:
      a flexure joined to the magnetic head slider,
      a load beam having one end connected to the flexure, and
      a base plate that is connected to the other end of the load beam.

9. A magnetic recording apparatus, comprising:
   a magnetic head slider including the MR element according to claim 1,
   a magnetic recording medium positioned opposite to the magnetic head slider,
   a spindle motor that rotary-drives the magnetic recording medium, and
   a device that supports the magnetic head slider, and that positions the magnetic head slider relative to the magnetic recording medium.

10. A magneto-resistive effect element (MR element), comprising: a first shield layer,
    a second shield layer,
    an inner shield layer that is positioned between the first shield layer and the second shield layer, and that faces the first shield layer and faces an air bearing surface (ABS), and
    a multilayer film that is positioned between the first shield layer and the second shield layer, wherein
    the multilayer film comprises:
       a free layer where its magnetization direction fluctuates relative to an external magnetic field,
       a first pinned layer that is positioned closer to the first shield layer than the free layer, and having magnetization direction fixed relative to the external magnetic field,
       a nonmagnetic spacer layer that is positioned between the free layer and the first pinned layer, a second pinned layer that is positioned closer to the first shield layer than the first pinned layer, and that fixes the magnetization direction of the first pinned layer, and an antiferromagnetic layer that is positioned closer to the first shield layer than the second pinned layer, and that is exchange-coupled with the second pinned layer;

the antiferromagnetic layer faces the back surface of the inner shield layer viewed from the ABS; and the MR element comprises a layer that is positioned between the antiferromagnetic layer and the inner shield layer, and that weakens exchange coupling between the antiferromagnetic layer and the inner shield layer, wherein the second pinned layer comprises a first part facing the back surface of the inner shield layer and a second part that makes contact with the first part, and that extends to the ABS between the first part and the first pinned layer and between the inner shield layer and the first pinned layer, and the layer that weakens the exchange coupling between the antiferromagnetic layer and the inner shield layer is positioned between the first part and the inner shield layer, and between the antiferromagnetic layer and the inner shield layer.

* * * * *